United States Patent
Park et al.

(10) Patent No.: US 6,803,791 B2
(45) Date of Patent: Oct. 12, 2004

(54) EQUALIZING RECEIVER WITH DATA TO CLOCK SKEW COMPENSATION

(75) Inventors: Hong-June Park, Pohang-shi (KR); Young-Soo Sohn, Seoul (KR)

(73) Assignees: Samsung Electronics Co., Ltd., Suwon-si (KR); Postech Foundation, Kyungbuk (KR)

( * ) Notice: Subject to any disclaimer, the term of this patent is extended or adjusted under 35 U.S.C. 154(b) by 88 days.

(21) Appl. No.: 10/347,795

(22) Filed: Jan. 22, 2003

(65) Prior Publication Data

US 2003/0137324 A1 Jul. 24, 2003

(30) Foreign Application Priority Data

Jan. 22, 2002 (KR) .......................................... 2002-3573

(51) Int. Cl.[7] ............................................. H03K 19/00
(52) U.S. Cl. ............................. 326/93; 326/99; 326/82
(58) Field of Search .............................. 326/93–96, 99, 326/82, 86, 90; 327/51, 52, 55, 319

(56) References Cited

U.S. PATENT DOCUMENTS 4,972,430 A * 11/1990 Cantwell ..................... 375/130
6,396,329 B1 * 5/2002 Zerbe ......................... 327/336

* cited by examiner

Primary Examiner—Anh Q. Tran
(74) Attorney, Agent, or Firm—Staas & Halsey LLP

(57) ABSTRACT

A receiver performs on data to clock skew compensation by compensating ISI between signals, the ISI being caused by a bandwidth limitation generated in case of chip-to-chip communications in a digital system. A problem of an attenuation of a high frequency signal may occur due to an attenuation in a channel in case of a transmission of a signal at a high speed in the digital system. Therefore there is a limitation in transmitting data at a high speed. The receiver provides a circuit for applying an equalizing technology at the terminal of the receiver. And by compensating for the attenuation of a high frequency component of the signal by using the circuit, the transmission of a signal at a high speed is realized by over-sampling the signal and compensating the data to clock skew.

3 Claims, 7 Drawing Sheets

1GBPS INPUT SIGNAL
(400PSEC JITTER)

PRE- AMP OUTPUT
NO EQUALIZATION
(400PSEC JITTER)

EQU- AMP OUTPUT
EVEN BRANCH
(50PSEC JITTER)

EQU- AMP OUTPUT
ODD BRANCH
(50PSEC JITTER)

FIG. 7

EQUALIZING RECEIVER WITH DATA TO CLOCK SKEW COMPENSATION

FIELD OF THE INVENTION

The present invention relates to an equalizing receiver; and, more particularly, to an equalizing receiver with data to clock skew compensation by compensating an inter-symbol interference (ISI) between signals.

BACKGROUND OF THE INVENTION

The amount of data transmission as well as transmission rate of the data in communications between DRAM (dynamic random access memory) and CPU(central processing unit) or between digital chips such as ASIC (application specific integrated circuit) have been kept rising.

However, in such communications the data transmission rate is limited by a time jitter occurring in a PLL (phase locked loop)/DLL (delay locked loop) circuit, an offset due to dimensional deviations in the process of producing transmitters and receivers and so on. Also a setup/hold time of a receiver circuit is not sufficiently long enough, due to a reduction in a data size margin and a time margin resulting from an ISI between signals. In such a case the ISI is generated by attenuation in high frequency components of signals in a transmission channel. Moreover, a time skew is generated due to a difference, in time required for transmitting a signal through a channel, between signals or between clock and the signal.

Furthermore, in order to transmit a signal at a high speed by overcoming a bandwidth limitation generated in transmission channels of a bus structure where a plurality of chips are connected to one conductive line in a digital system, pre-emphasis is frequently employed as an equalizing technology adopted in a transmitter.

Figure 1A:
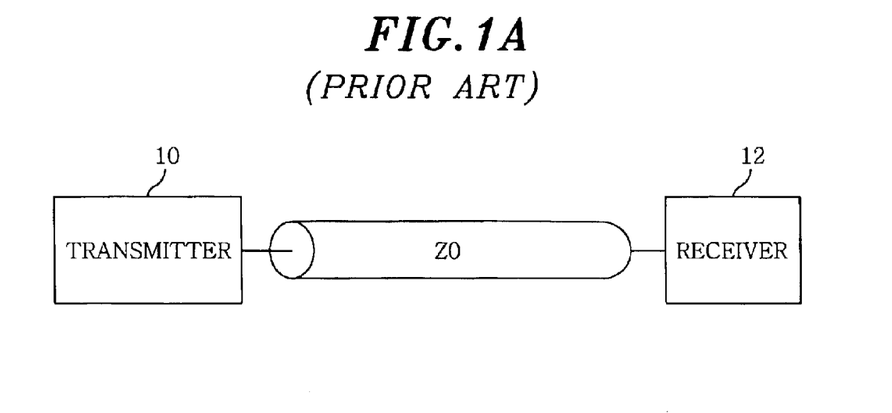
FIGS. 1A to 1C show a conventional principle of operating an equalizing circuit in the receiver.
Figure 1B:
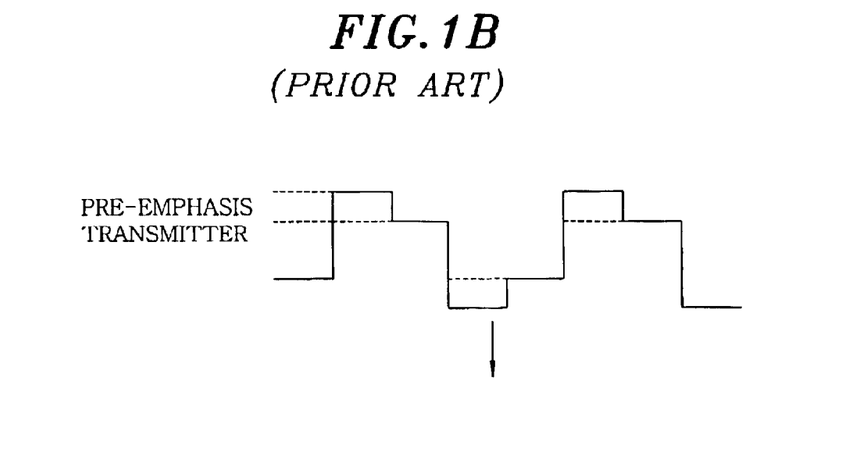
Figure 1C:
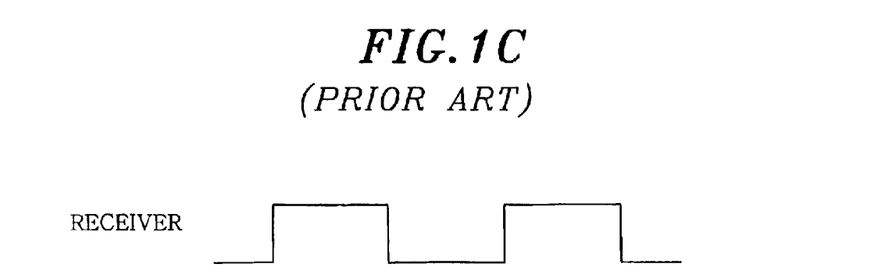

FIGS. 1A to 1C show a conventional principle of operating an equalizing circuit in the transmitter. A current method of technology for amplifying and transmitting a high frequency component of a signal inputted requires an additional current to the equalizing circuit during a signal variation.

Referring to FIG. 1B, when an output signal of a transmitter 10 in FIG. 1A is switched from an original low level to an original high level, an additional current is provided so that the signal is emphasized to a higher level than the original high level for one time period, and if there is no variation in an input signal fed to the transmitter 10 after the one time period, the signal is changed from the higher level to the original high level. When the output signal of the transmitter 10 is switched from the original high level to the original low level, an additional current is provided so that the signal is emphasized to a lower level than the original low level for one time period, and if there is no variation in the input signal fed to the transmitter 10 after the one time period, the signal is changed from the lower level to the original low level. Therefore, a receiver 12 in FIG. 1C can receive a signal that has been compensated for an attenuation in a high frequency component, occurring in a transmission channel.

However, the above-mentioned equalizing technology employed in the transmitter cannot be used in a system employing a full swing voltage method in controlling signals. In a system employing such method, emphasis on the output signal cannot be obtained due to a full swing of voltage in the transmitter. Thus, the ineffective equalizing technology employed in the transmitter becomes a bottleneck in a high speed transmission in case a bandwidth of a channel is limited. Examples of systems that employ the technology for controlling signal by the full swing voltage method in a transmitter are "DDR (double data rate) SDRAM", "SDR (single data rate) SDRAM", and the like.

Due to a difference in time required for transmitting a signal through a channel, there is a time skew between transmitted signals and between a clock and a transmitted signal. The skew has an adverse effect on a transmission at high speed. For the normal operation of an input circuit in a receiver, a setup/hold time should be sufficient as needed, but the skew makes it difficult.

Figure 2:
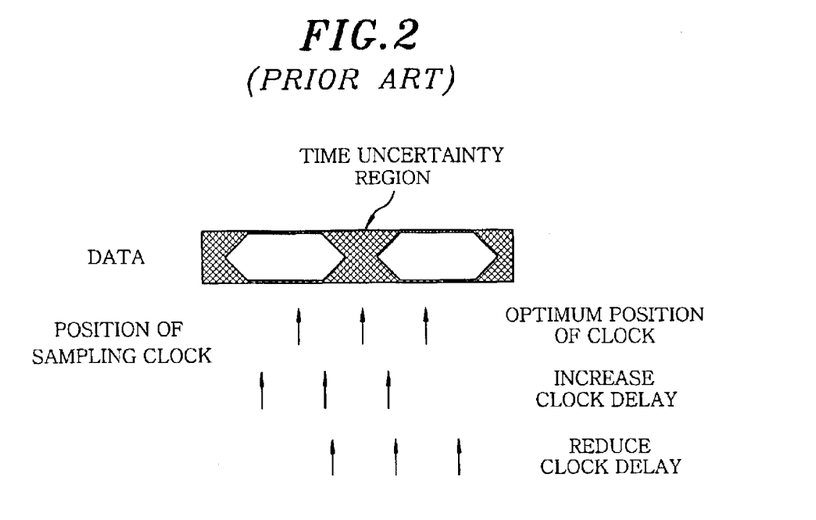
FIG. 2 describes a conventional principle of sampling a timing of a clock with that of data by over-sampling.

As shown in FIG. 2, in the prior art, in order to determine a suitable timing of a clock, a proper sampling time is determined by over-sampling a transmitted signal (data are sampled twice or more per one period of a signal) per each data pin. That is, the data of the signal are sampled three times in two periods of the signal, and if first two samples have a same value, a delay of a sampling clock is increased. On the other hand, if last two samples have a same value, the delay time of the sampling clock is reduced. Through this feedback procedure, clock with a suitable delay (the timing of a sampling clock is determined to be in the middle of a specific portion of a stream of the data) is provided for a pin based on the difference in delay of the data.

In determining a suitable timing of a clock by the over-sampling method, a signal with minimal attenuation in time scale should be used. That is, if a high frequency component of the signal is considerably attenuated in the course while passing through a transmission channel, a time uncertain region of data shown in FIG. 2 is broadened, and the method for determining the suitability of the clock by the over-sampling becomes ineffective. Thus the method cannot be used in a channel where a high frequency component of a signal is seriously attenuated.

In transmitting a signal in the above-mentioned digital system, there are problems as follows.

First, when a signal is transmitted at a high speed in a channel of the digital system, a high frequency component in the signal may be attenuated. Such phenomenon causes an ISI between signals and reduces a time margin and a voltage margin of an input signal. Thus, there is great difficulty in achieving data transmission at a high speed.

Second, in the prior art, in order to solve such phenomenon, an equalizing technology is applied to a terminal of a transmitter, so that the attenuated component is compensated. However, such equalizing technology is not applicable to DRAM or ASIC where a voltage at the terminal of the transmitter has a waveform of a full swing.

Third, when a clock signal is transmitted with data from the transmitter to a receiver, a skew is generated due to a difference in a delay time which is a time required for the signal to pass through a transmission channel, which in turn reduces a time margin of data.

Fourth, in order to solve the skew problem, an oversampling technology is employed to find a suitable timing of clock. However, in the occurrence of an attenuation of a signal, there is great difficulty in applying such method to a broadened time uncertain region.

SUMMARY OF THE INVENTION

It is, therefore, an object of the present invention to provide an equalizing receiver for compensating an attenuation of a high frequency component in a signal and further over-sampling the compensated signal so that a skew between the data and clock is compensated, thereby facilitating a high speed data transmission.

In accordance with the present invention, there is provided an equalizing receiver performing on data to clock skew compensation, the equalizing receiver including: an equalizer for equalizing an external data signal fed thereto; an over-sampler for sampling the equalized data signal provided by the equalizer against a sampling clock; a clock-data phase detector for determining a timing of the sampling clock by analyzing an output of the over-sampler; and a clock synthesizer for providing the over-sampler with the sampling clock obtained by synthesizing an external clock signal based on the timing of the sampling clock, wherein the equalizer includes a first and a second equalizing amplifier and the over-sampler includes a first, a second, a third and a fourth sense amplifier, in which an output signal thereof is divided into an even and an odd branch.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Preferred embodiments of the present invention are explained in detail with reference to drawings as follows.

Figure 3:
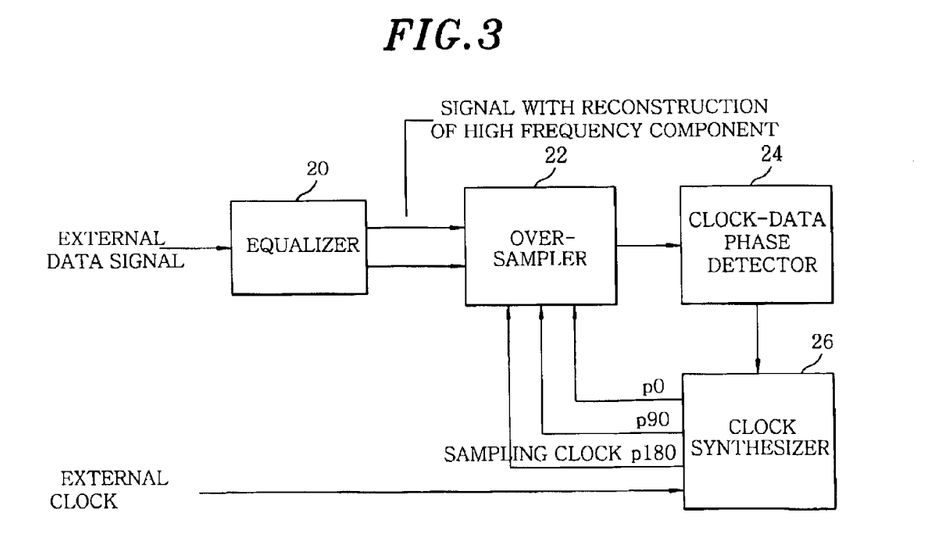
FIG. 3 illustrates a receiver with data to clock skew compensation employing an equalizing technology in accordance with a preferred embodiment of the present invention.

FIG. 3 is a block diagram illustrating a receiver with data to clock skew compensation using an equalizing technology in accordance with a preferred embodiment of the present invention, which includes an equalizer 20, an over-sampler 22, a clock-data phase detector 24, and a clock synthesizer 26. An external data signal with an attenuated high frequency component is fed to the equalizer 20 and an external clock signal synchronized with the external data signal is fed to the clock synthesizer 26. For example, a DDR technology is applied to the receiver, wherein the data rate of an external data signal is 1 Gbps, and a 500 Mhz external clock signal is fed to the clock synthesizer.

In the same figure, the equalizer 20 equalizes the external data signal fed to the equalizer, and provides the over-sampler 22 with an equalized data signal. In the course of this process, a high frequency component of the external data signal is amplified.

Figure 4A:
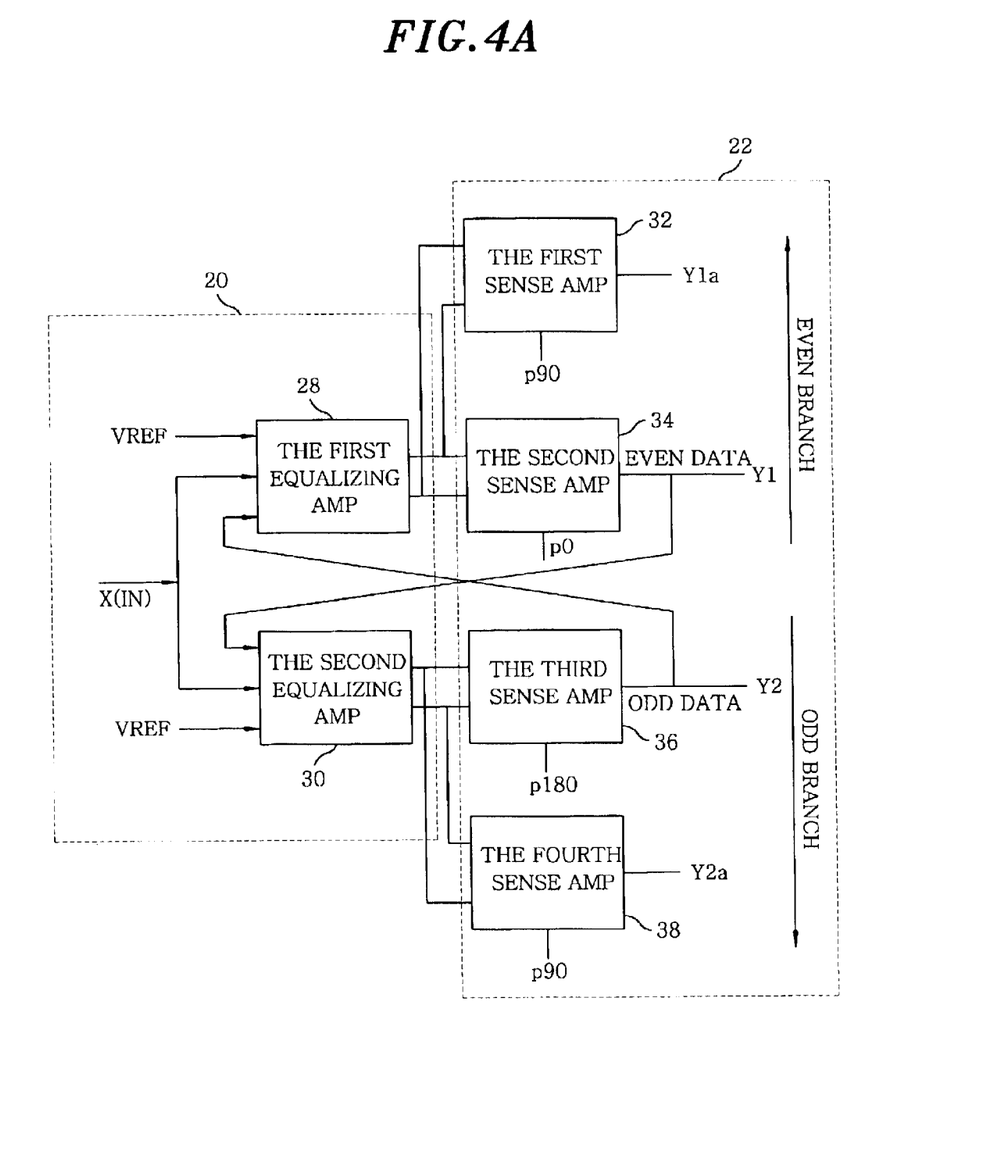
FIGS. 4A and 4B offer detailed structures of the equalizer and the over-sampler illustrated in FIG. 3, respectively.

The over-sampler 22 samples the equalized data signal provided by the equalizer with a sampling clock provided by the clock synthesizer 26, and provides sampled values Y1, Y1$a$, Y2$a$, and Y2 to the clock-data phase detector 24 as shown in FIG. 3 and FIG. 4A.

The clock-data phase detector 24 analyzes the sampled values Y1, Y1$a$, Y2, and Y2$a$ provided from the over-sampler 22, and determines a timing of the sampling clock. And an output signal containing information on the timing of the sampling clock is fed to the clock synthesizer 26.

The clock synthesizer 26 provides the over-sampler 22 with an adjusted sampling clock obtained by synthesizing the external clock based on the timing of the sampling clock.

Figure 4B:
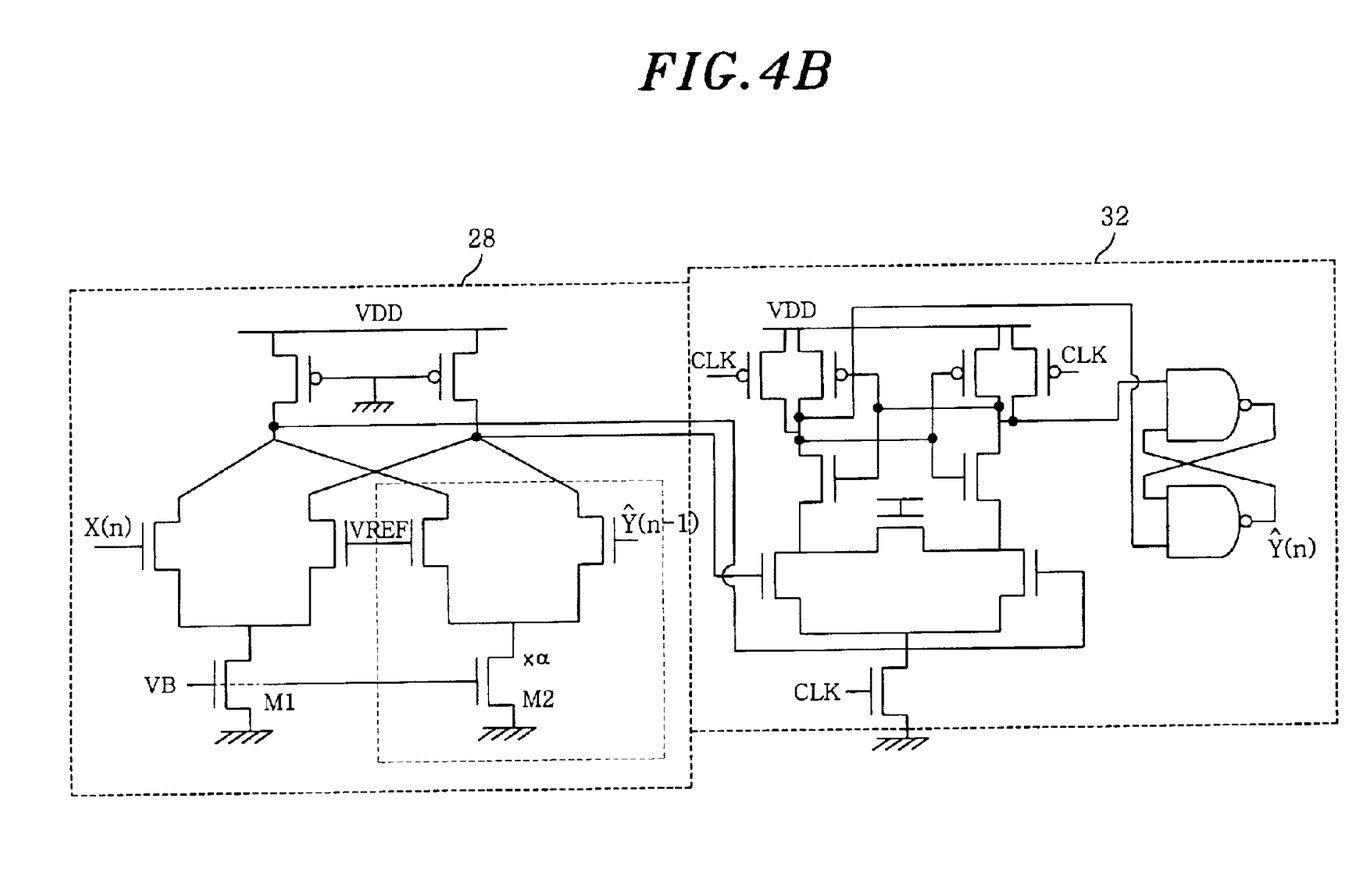

FIG. 4A offers an embodiment of the equalizer 20 and the over-sampler 22 illustrated in the FIG. 3. In FIG. 4A the equalizer 20 includes a first and a second equalizing amplifier 28, 30, and the over-sampler 22 includes a first, a second, a third and a fourth sense amplifier 32, 34, 36, 38. FIG. 4B is a circuit diagram showing respective embodiments of the first equalizing amplifier 28 and the first sense amplifier 32. A circuit in a dotted small rectangular inside a dotted big rectangular 28 in FIG. 4B is a current controllable circuit.

In FIG. 4A, the over-sampler includes an even branch and an odd branch. The even branch is synchronized with 0° phase sampling clock and the odd branch with 180°. Herein, the speed of operation in each branch is twice as fast as that of a signal fed to the equalizer 20. Also, the first, the second, the third and the fourth sense amplifier 32, 34, 36, 38 use D flip/flop that is synchronized with a 90° phase sampling clock in order to perform over-sampling.

An output of one branch of the two branches is cross-coupled to the equalizing amplifier included in the other branch of the two. Among inputs of the first equalizing amplifier 28, a present input signal is fed to X(n) and a reference voltage to the present input signal is fed to two VREF ports, while an output of the odd branch is fed to $\hat{Y}$ (n−1). The equalizing amplifier amplifies a difference between the present input signal X(n) and the fraction of a preceding decision result $\alpha\hat{Y}$ (n−1) to remove the ISI component. The size ratio of M1 and M2 in FIG. 4B decides an equalizing ratio $\alpha$. And the output voltage Y(n) of the equalizing amplifier can be represented as follows.

$$Y(n)=X(n)-\alpha\hat{Y}(n-1)$$

Since the ISI component $\alpha\hat{Y}$ (n−1) is subtracted from the present input signal X(n), the ISI component is much reduced in the equalized amplifier output Y(n). The block diagram of over-sampler 22 is shown in the right hand side of FIG. 4A. The equalized output Y(n) is sampled at the edges of 0 phase (Y1), 90° phase (Y1$a$, Y2$a$) and 180° phase (Y2) sampling clocks. The Y1 and Y2 samples are used for equalization and data output.

Figure 5:
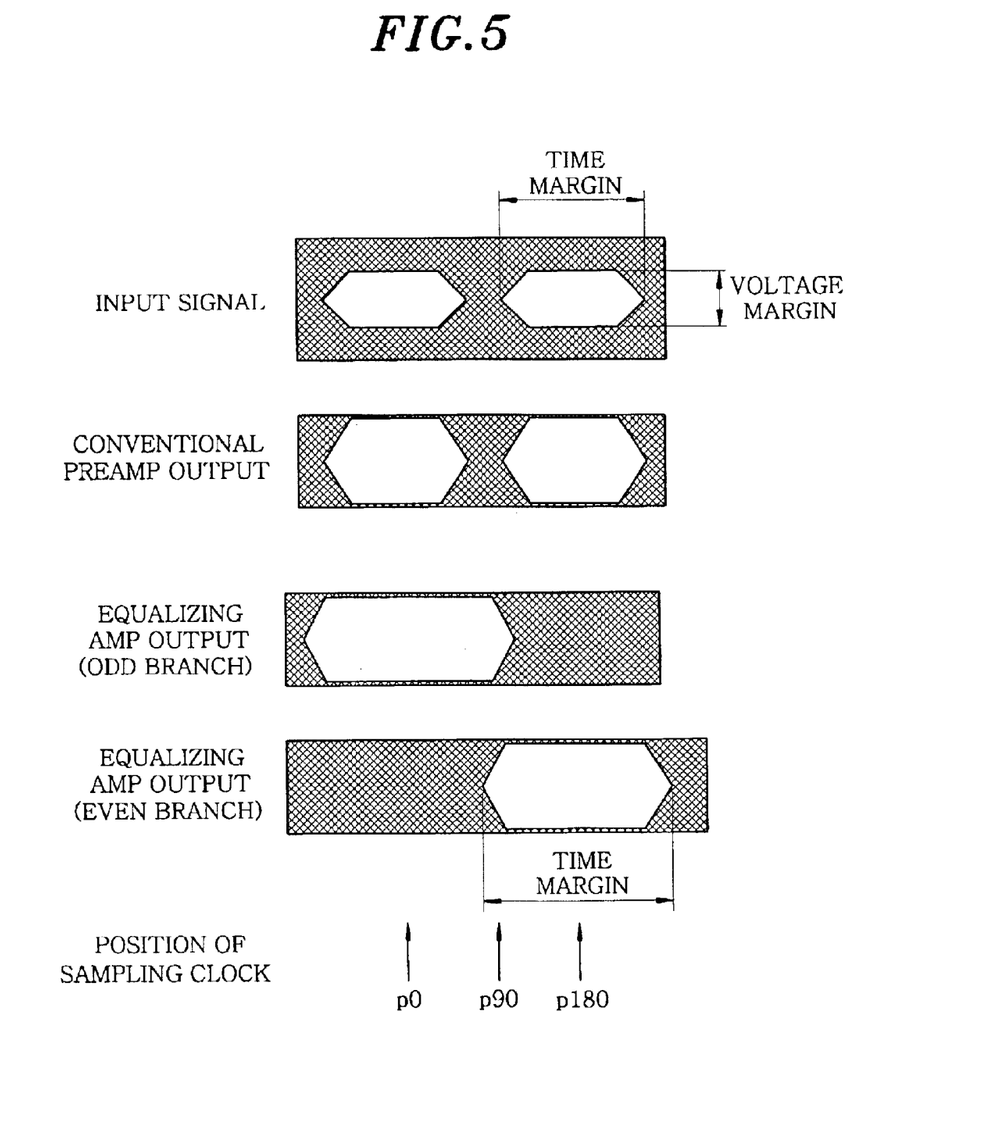
FIG. 5 provides a waveform of a signal in an equalizing circuit in operation and a relationship between an input signal to the equalizing circuit and an equalized output signal by the equalizing circuit in accordance with the present invention.
Figure 6:
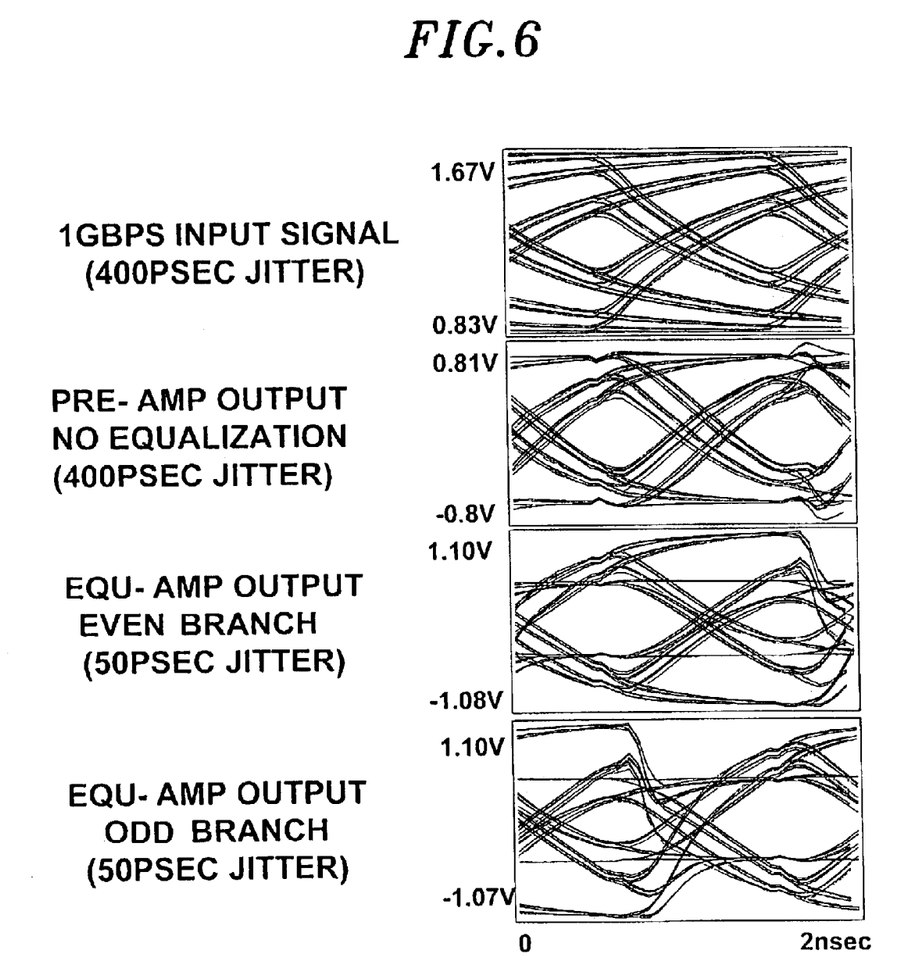
FIG. 6 presents outputs obtained by simulating an equalizing circuit in accordance with the present invention.

FIG. 5 and FIG. 6 show simulated eye patterns at input and output nodes of the equalized amplifier. Due to a limited channel bandwidth, both voltage and time margins of an external input signal are reduced. The output voltage of the conventional receiver without equalization showed the same amount of time margin as the external input signal. However, the time margin was increased in the output waveforms of the equalizing amplifier due to the reduction of ISI components.

Figure 7:
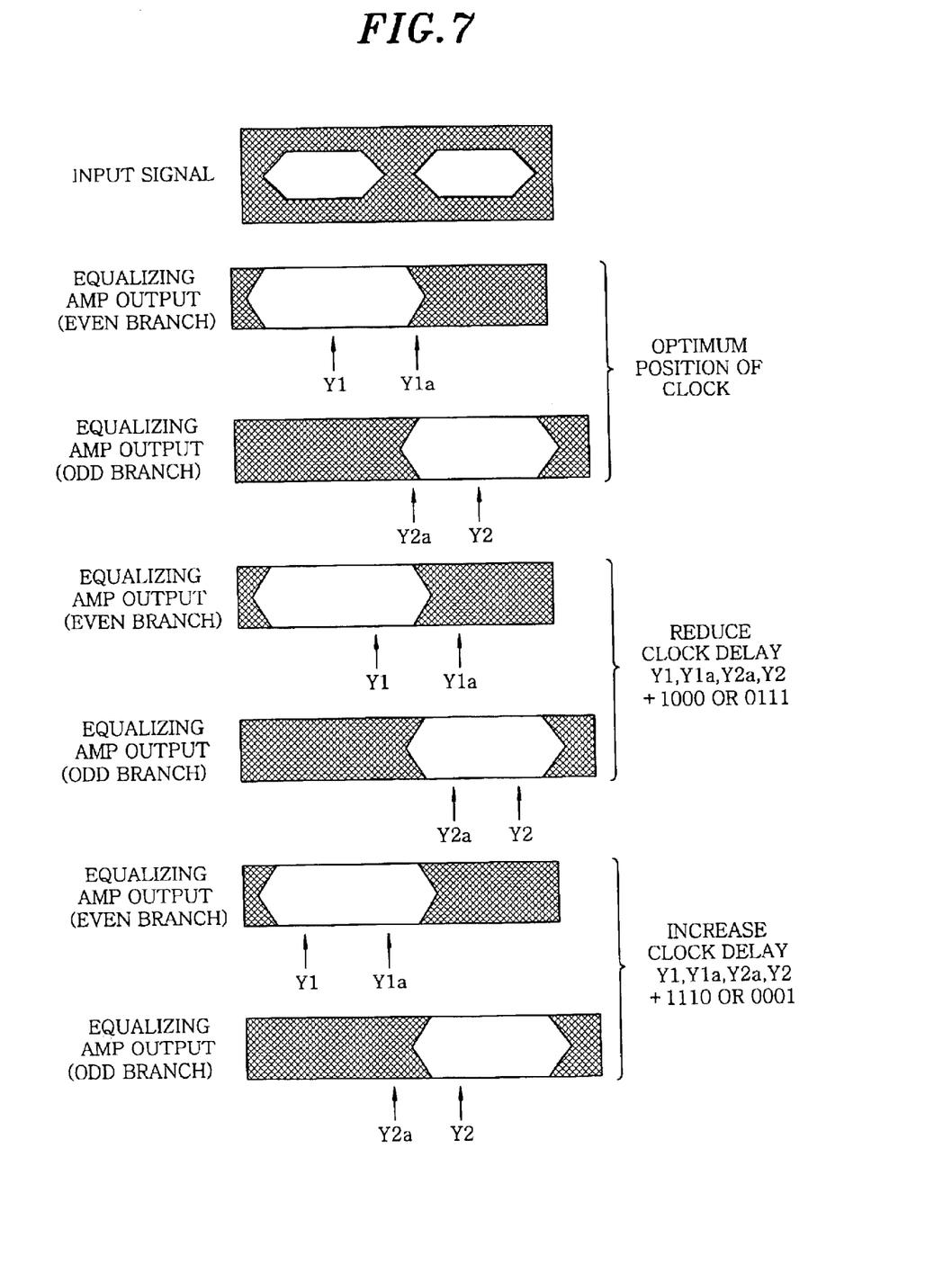
FIG. 7 depicts a principle of sampling a timing of a clock with that of data by over-sampling in accordance with the present invention.

FIG. 7 depicts a principle of comparing a timing of a sampling clock with that of data by over-sampling in accordance with the present invention. In the prior art, the timing of a sampling clock is adjusted after oversampling an input signal like shown in FIG. 2. On the other hand, in accordance with the present invention, the timing of the sampling clock is adjusted by using results of sampling operation, which is carried out at each branch in FIG. 4. In FIG. 5, p0 means a 0° phase sampling clock, p90 means a 90° phase sampling clock and p180 means a 180° phase sampling clock. The timing of the sampling clock is adjusted by using 4 factors, two of them being outputs Y1, Y1a of over-sampling operation which is carried out in the first equalizing amplifier of the even branch, synchronized with the p0 and p90 sampling clocks and the other two of them being outputs Y2a, Y2 of over-sampling operation which is carried out in the second equalizing amplifier of the odd branch, synchronized with the p90 and p180 sampling clocks.

When Y1, Y1a, Y2a, Y2 are taken into consideration, if the first three of them have a same output value, a delay time of the sampling clock is increased, and while if the last three have a same output value, the delay time of the sampling clock is decreased. Except for these two cases, the delay time of the sampling clock is unchanged. The above-mentioned feedback procedure is repeated. By applying the feedback procedure, an optimum sampling time, i.e., a center point of an external input data can be found by compensating an attenuation of a high frequency component of the external input signal, even if a time uncertainty region of the external input data is broadened by the attenuation of the external input signal.

While the invention has been shown and described with respect to the preferred embodiments, it will be understood by those skilled in the art that various changes and modifications may be made without departing from the spirit and the scope of the invention as defined in the following claims.

What is claimed is:

1. An equalizing receiver performing on data to clock skew compensation, the equalizing receiver comprising:
   an equalizer for equalizing an external data signal fed thereto;
   an over-sampler for sampling the equalized data signal provided by the equalizer against a sampling clock;
   a clock-data phase detector for determining a timing of the sampling clock by analyzing an output of the over-sampler; and
   a clock synthesizer for providing the over-sampler with the sampling clock obtained by synthesizing an external clock signal based on the timing of the sampling clock,
   wherein the equalizer includes a first and a second equalizing amplifier and the over-sampler includes a first, a second, a third and a fourth sense amplifier, in which an output signal thereof is divided into an even and an odd branch.

2. The equalizing receiver compensating data to clock skew of claim 1, wherein the even branch of the output signal of the over-sampler is synchronized at a 0° and a 90° phase sampling clock, and the odd branch is synchronized at the 90° and a 180° phase sampling clock, and after sampling the output of the respective equalizing amplifiers, sample outputs of the odd and the even branch are fed to the equalizing amplifier.

3. The equalizing receiver compensating data to clock skew of claim 2, wherein, of the first, second, third and fourth sense amplifiers, if the first three have a same output value, a delay of the sampling clock is increased, whereas if the latter three have a same output value, the delay of the sampling clock is reduced.

* * * * *